United States Patent
Enomoto et al.

(10) Patent No.: US 7,449,957 B2
(45) Date of Patent: Nov. 11, 2008

(54) RADIO FREQUENCY POWER AMPLIFIER

(75) Inventors: Shingo Enomoto, Osaka (JP);
Masahiko Inamori, Osaka (JP);
Haruhiko Koizumi, Osaka (JP); Kazuki Tateoka, Kyoto (JP); Hirokazu Makihara, Osaka (JP); Shingo Matuda, Kyoto (JP); Katuhiko Kawashima, Hyogo (JP)

(73) Assignee: Panasonic Corporation, Osaka (JP)

( * ) Notice: Subject to any disclaimer, the term of this patent is extended or adjusted under 35 U.S.C. 154(b) by 86 days.

(21) Appl. No.: 11/435,891

(22) Filed: May 18, 2006

(65) Prior Publication Data

US 2006/0261897 A1 Nov. 23, 2006

(30) Foreign Application Priority Data

May 20, 2005 (JP) ............................ 2005-148103

(51) Int. Cl.
*H03F 3/68* (2006.01)
*H03F 3/191* (2006.01)
(52) U.S. Cl. ...................................... 330/295; 330/302
(58) Field of Classification Search ................ 330/295, 330/302, 258; 327/143; 300/295, 302
See application file for complete search history.

(56) References Cited

U.S. PATENT DOCUMENTS

| | | | |
|---|---|---|---|
| 5,321,279 A | 6/1994 | Khatibzadeh et al. | |
| 5,608,353 A | 3/1997 | Pratt | |
| 6,653,902 B1 | 11/2003 | Bachhuber et al. | |
| 6,727,761 B1 * | 4/2004 | Apel | 330/295 |
| 6,768,381 B2 * | 7/2004 | Kuriyama | 330/295 |
| 2001/0024141 A1 * | 9/2001 | Kuriyama | 330/295 |
| 2002/0097096 A1 * | 7/2002 | Brandt | 330/295 |
| 2002/0097097 A1 | 7/2002 | Sugiura | |
| 2003/0201832 A1 * | 10/2003 | Patterson | 330/295 |
| 2004/0113699 A1 | 6/2004 | Kondo et al. | |
| 2004/0164804 A1 | 8/2004 | Cho et al. | |
| 2005/0218990 A1 * | 10/2005 | Makioka | 330/295 |

FOREIGN PATENT DOCUMENTS

JP 4027349 10/2007

OTHER PUBLICATIONS

European Search Report issued in corresponding European Patent Application No. EP 06 01 0419.7, dated Aug. 14, 2006.

* cited by examiner

*Primary Examiner*—Robert Pascal
*Assistant Examiner*—Khiem D Nguyen
(74) *Attorney, Agent, or Firm*—McDermott Will & Emery LLP

(57) ABSTRACT

A radio frequency signal RF is input to a base of each of transistors TR1 through TRn via a corresponding capacitor among capacitors C1 through Cn, is amplified, and is output from a collector of each of the transistors TR1 through TRn. An emitter of each of the transistors TR1 through TRn is grounded. A bias voltage DC given from a bias circuit Bias is supplied to the base of each of the transistors TR1 through TRn via a corresponding resistor among resistors Ra1 through Ran. A signal line for the bias voltage DC is connected to an input line for the radio frequency signal RF via the bridge resistor R in a direct current manner.

14 Claims, 15 Drawing Sheets

FIG. 3C

| NUMBER OF TRANSISTORS | 6 0 |
|---|---|
| AREA SIZE OF EMITTERS [$\mu m^2$] | 7 2 0 0 |
| CAPASITANCE VALUE OF THE CAPASITORS C1-Cn [pF] | 0 . 5 |
| INPUT MATCHING ZS [ohm] | 5 . 1 + j 0 . 4 |
| OUTPUT MATCHING ZL [ohm] | 2 . 9 − j 1 . 0 |
| COLLECTOR VOLTAGE [V] | 3 . 5 |
| IDLE CURRENT [mA] | 1 2 0 |
| INPUT POWER [dBm] | 2 5 |
| FREQUENCY [MHz] | 8 8 7 |

RADIO FREQUENCY POWER AMPLIFIER

BACKGROUND OF THE INVENTION

1. Field of the Invention

The present invention relates to a radio frequency power amplifier suitable for power amplification of a radio frequency signal.

2. Description of the Background Art

An amplifier used for a wireless communication device such as a mobile phone or the like generally uses a structure in which a plurality of, for example, two or three, compound semiconductor transistors for radio frequency amplification are connected to each other. As such a compound semiconductor transistor, a hetero-junction bipolar transistor has mainly been used recently for the reason regarding the single positive power source operation or the like. A final-stage amplifier for a mobile phone having an output power of about 1 to 3 W is provided by connecting a plurality of transistors in parallel to combine the outputs from the transistors, in order to obtain radio frequency characteristics and a high output. FIG. 10 shows an example of a conventional radio frequency power amplifier 100 having such a structure. See, for example, U.S. Pat. Nos. 5,321,279 and 5,608,353.

With the conventional radio frequency power amplifier 100 shown in FIG. 10, a direct current bias voltage (DC) given from a bias circuit (Bias) is supplied to bases (B) of transistors TR101 through TR10$n$ via corresponding resistors Ra101 through Ra10$n$. A radio frequency signal (RF), which is an AC signal, is input to the bases of the transistors TR101 through TR10$n$ via corresponding capacitors C101 through C10$n$. The reason why the bias voltage (DC) and the radio frequency signal (RF) are input to the bases of the transistors TR101 through TR10$n$ via separate paths is as follows.

The transistors TR101 through TR10$n$ generate heat when performing a high output operation because the current density of the AC current is raised. The heat generation is not uniform among all the transistors TR101 through TR10$n$ due to a characteristic dispersion among the transistors TR101 through TR10$n$ or the like. A specific transistor having a high temperature may cause thermal runaway due to excessive heat generation during operation and destroy the device due to an increase in the base current. According to a conceivable technique for suppressing the thermal runaway, when base voltages of the transistors TR101 through TR10$n$ increase, the resistance values of the resistors Ra101 through Ra10$n$ are increased such that the base bias current supplied from the bias circuit (Bias) decreases.

In the above-described radio frequency power amplifier 100, the thermal runaway of the transistors Ra101 through Ra10$n$ is suppressed and thus uniform operation thereof is realized by increasing the resistance values of the resistors Ra101 through Ra10$n$.

However, the resistance values of the resistors Ra101 through Ra10$n$ cannot be very large because excessively large resistance values of the resistors Ra101 through Ra10$n$ decrease a power gain of a radio frequency signal. Namely, the operation uniformity among the transistors TR101 through TR10$n$ improved by increasing the resistance values of the resistors Ra101 through Ra10$n$ (improvement in the destruction resistance) contradicts the radio frequency power gain improved by decreasing the resistance values of the resistors Ra101 through Ra10$n$ (improvement in the radio frequency characteristics). It is very difficult to improve both.

SUMMARY OF THE INVENTION

Therefore, an object of the present invention is to provide a radio frequency power amplifier providing both of a sufficient destruction resistance and superb radio frequency characteristics.

The present invention is directed to a radio frequency power amplifier usable for power amplification of a radio frequency signal. In order to attain the object mentioned above, the radio frequency power amplifier according to the present invention comprises a plurality of transistors connected in parallel and each having a grounded emitter; a plurality of resistors each having one terminal commonly supplied with a direct current bias voltage and the other terminal connected to a base of the corresponding transistor among the plurality of transistors; a plurality of capacitors each having one electrode for commonly receiving the radio frequency signal and the other electrode connected to the base of the corresponding transistor among the plurality of transistors; and at least one bridge resistor for connecting the one terminal of each of the plurality of resistors and the one electrode of each of the plurality of capacitors.

It is not absolutely necessary that a plurality of capacitors are provided. The radio frequency signal may be input to the bases of the plurality of transistors via one capacitor. A plurality of bridge resistors may be provided respectively in correspondence with the plurality of resistors. Typically, a direct current bias voltage is supplied from a bias circuit which uses an emitter follower as an output structure.

Preferably, a plurality of second resistors are each inserted between a connection point of the other terminal of the corresponding resistor among the plurality of resistors and the other electrode of one capacitor or the corresponding capacitor among the plurality of capacitors, and the base of the corresponding transistor among the plurality of transistors. Alternatively, a plurality of second resistors are each inserted between the other electrode of one capacitor or the corresponding capacitor among the plurality of capacitors and the base of the corresponding transistor among the plurality of transistors. Still alternatively, a plurality of second resistors are each inserted between a terminal of the at least one bridge resistor, to which the radio frequency signal is input, and the one electrode of one capacitor or the corresponding capacitor among the plurality of capacitors. In this case, the second resistances may each include a transmission line.

According to the present invention, a radio frequency power amplifier including a plurality of transistors connected in parallel further comprises one or a plurality of bridge resistors. Thus, both of a sufficient destruction resistance and superb radio frequency characteristics are provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3C shows parameters used for the simulation shown in FIG. 3A and FIG. 3B;

DESCRIPTION OF THE PREFERRED EMBODIMENTS

First Embodiment

Figure 1:
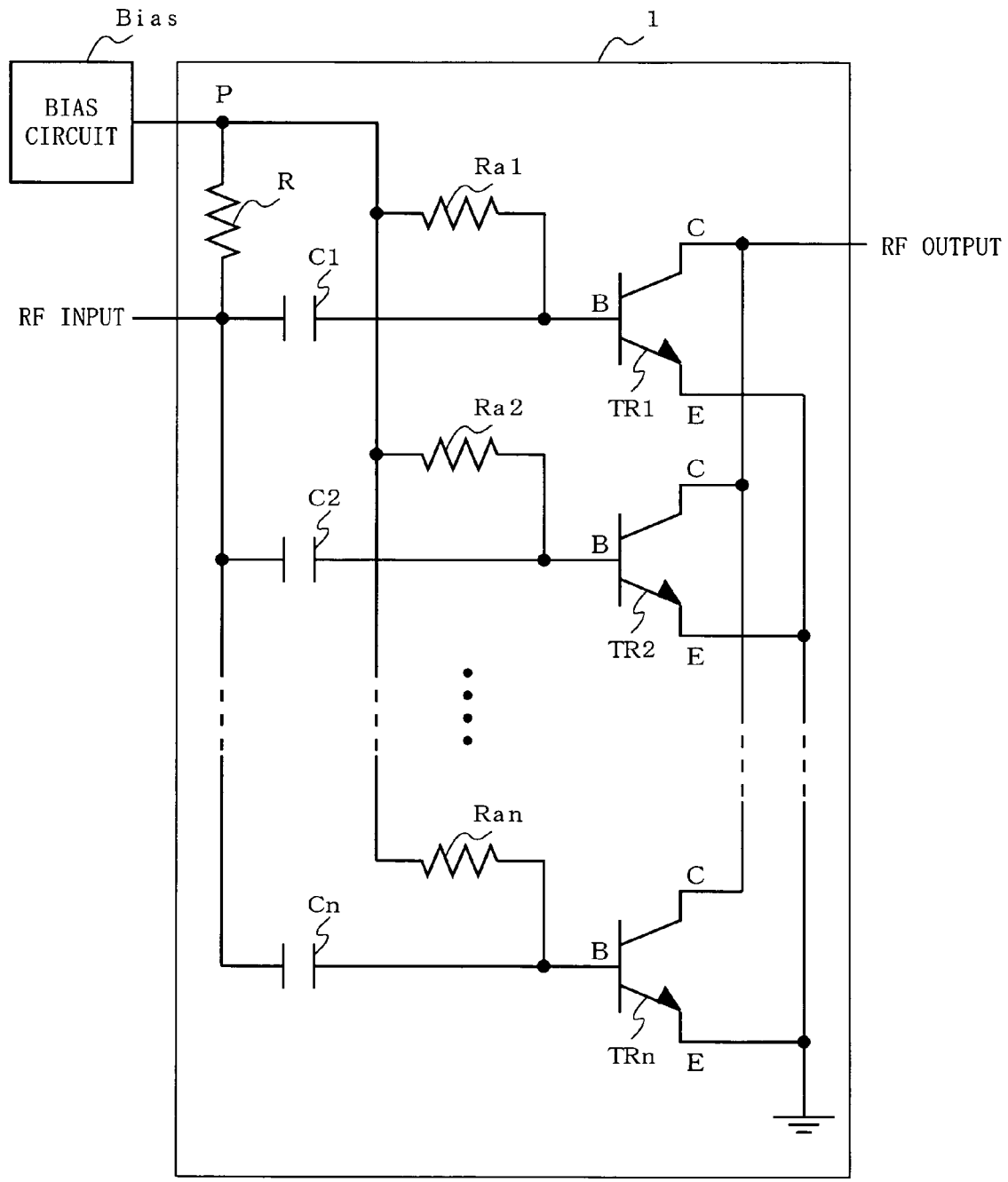
FIG. 1 shows a circuit configuration of a radio frequency power amplifier 1 according to a first embodiment of the present invention.

FIG. 1 shows a circuit configuration of a radio frequency power amplifier 1 according to a first embodiment of the present invention. As shown in FIG. 1, the radio frequency power amplifier 1 according to the first embodiment includes transistors TR1 through TRn, capacitors C1 through Cn, resistors Ra1 through Ran, and a bridge resistor R. Herein, n is an integer equal to or greater than two. As the transistors TR1 through TRn, hetero-junction bipolar transistors using a compound semiconductor (InGaP) or other types of transistors using Si or SiGe are usable.

A radio frequency signal (RF), which is an AC signal, is input to a base (B) of each of the transistors TR1 through TRn via the corresponding capacitor among the capacitors C1 through Cn, is amplified, and is output from a collector (C) of each of the transistors TR1 through TRn. An emitter (E) of each of the transistors TR1 through TRn is grounded. A direct current bias voltage (DC) given from a bias circuit (Bias) is supplied to the base of each of the transistors TR1 through TRn via the corresponding resistor among the resistors Ra1 through Ran. A signal line for the bias voltage (DC) is connected to an input line for the radio frequency signal (RF) via the bridge resistor R in a direct current manner. The bias circuit (Bias) may have any structure which can supply a bias voltage (DC).

Figure 2:
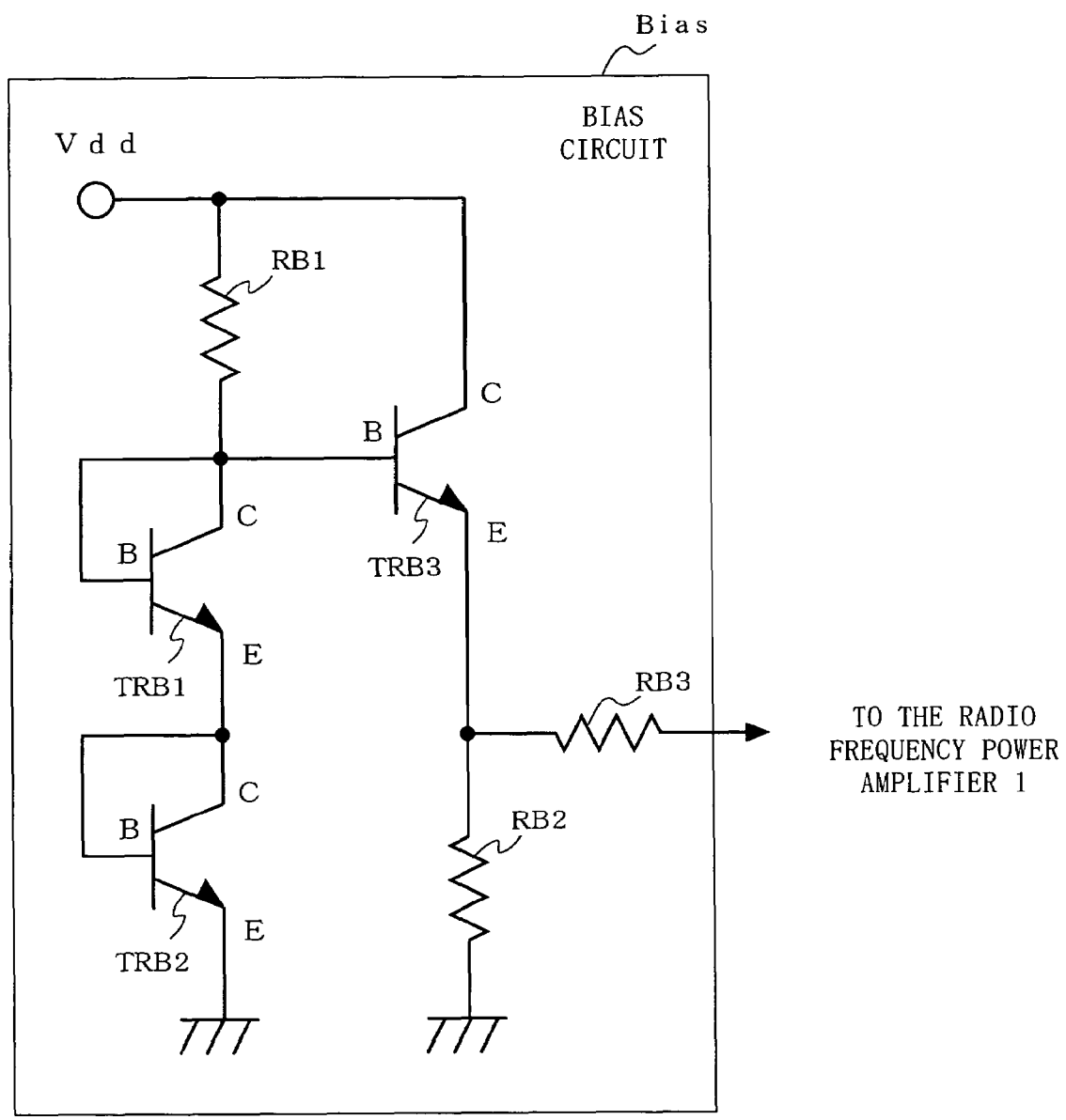
FIG. 2 shows an example of a bias circuit (Bias)

For example, an emitter follower circuit shown in FIG. 2 may be preferable as the bias circuit (Bias). The bias circuit (Bias) shown in FIG. 2 includes a transistor TRB3 acting as an emitter follower, a resistor RB1 for compensating for a temperature characteristic, resistors RB2 and RB3 for correcting a bias circuit characteristic, and transistors TRB1 and TRB2. The transistors TRB1 and TRB2 are each used as a base-emitter diode with the base and the collector being short circuited, in order to compensate for a sum of base-emitter voltages between the transistors TR1 through TRn and the transistor TRB3. The resistors RB2 and RB3 may be omitted.

An operation of the radio frequency power amplifier 1 according to the first embodiment having the above-described structure will be described.

Since the bridge resistor R is inserted, a radio frequency signal (RF) is input to the base of each of the transistors TR1 through TRn via a path passing through the bridge resistor R and each of the resistors Ra1 through Ran as well as via a conventional path passing through each of the capacitors C1 through Cn. Owing to the path passing through the bridge resistor R and the resistors Ra1 through Ran, the radio frequency signal (RF) is input toward the bias circuit (Bias) via the bridge resistor R.

Because of the nonlinearity of a base-emitter diode of the transistor TRB3, the voltage amplitude of the radio frequency signal (RF) which is input toward the bias circuit (Bias) is clipped at the time when the base-emitter diode of the transistor TRB3 is turned on (negative amplitude), but is not clipped at the time when the base-emitter diode of the transistor TRB3 is turned off (positive amplitude). As a result, a positive direct current offset voltage is generated at a connection point P between the bridge resistor R and the resistors Ra1 through Ran. The effect of the positive direct current offset voltage is more conspicuous as the input power of the radio frequency signal (RF) is larger.

Figure 3A:
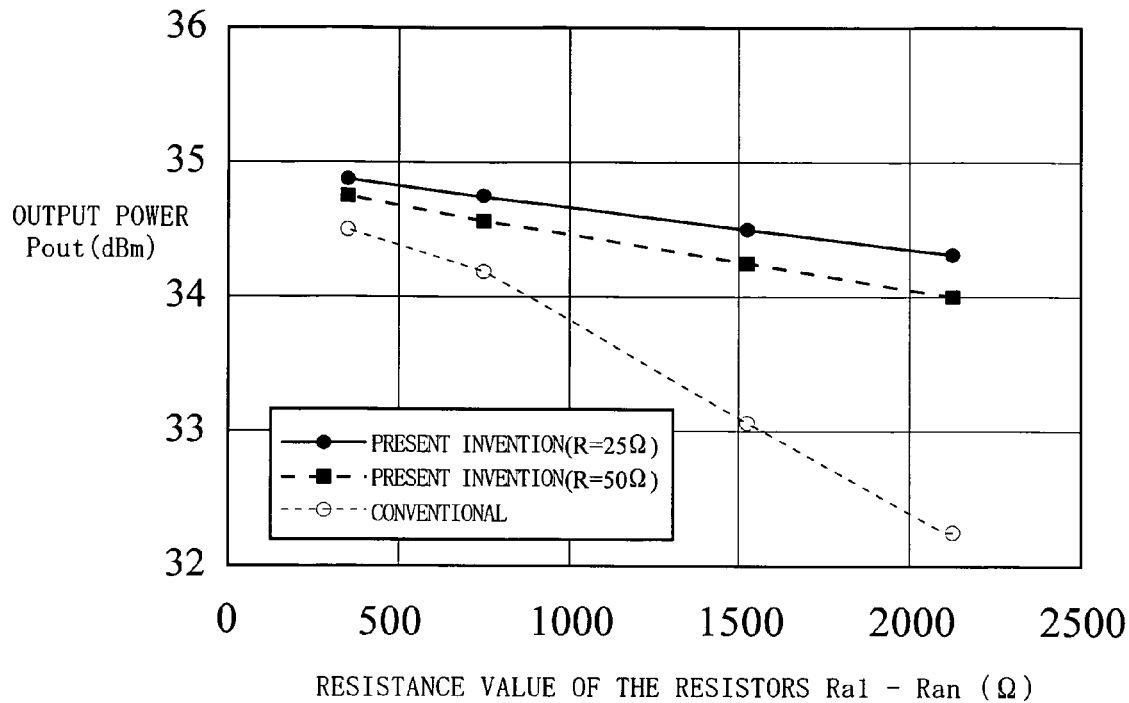
FIG. 3A illustrates the relationship between the resistance value of resistors Ra1 through Ra$n$ and the output power Pout.
Figure 3B:
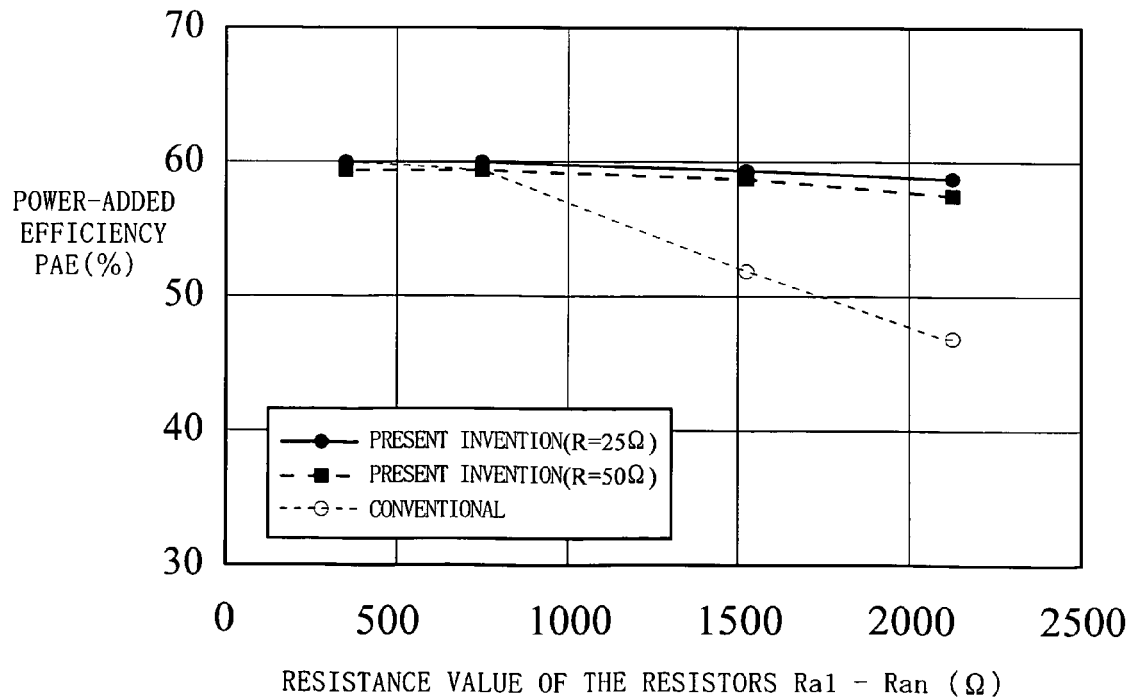
FIG. 3B illustrates the relationship between the resistance value of the resistors Ra1 through Ra$n$ and the power-added efficiency PAE.
Figure 10:
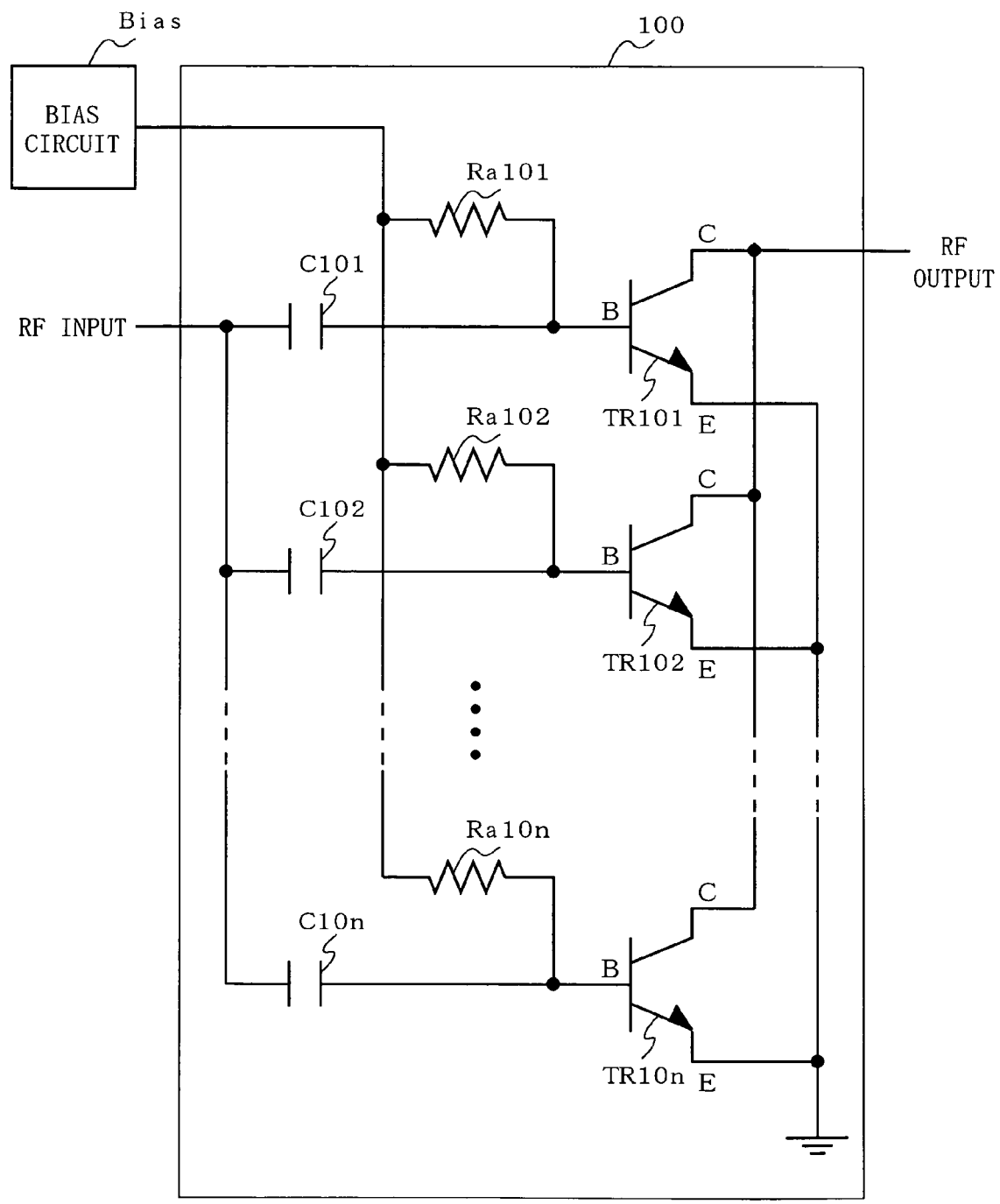
FIG. 10 shows a circuit configuration of a conventional radio frequency power amplifier 100.
Figure 11:
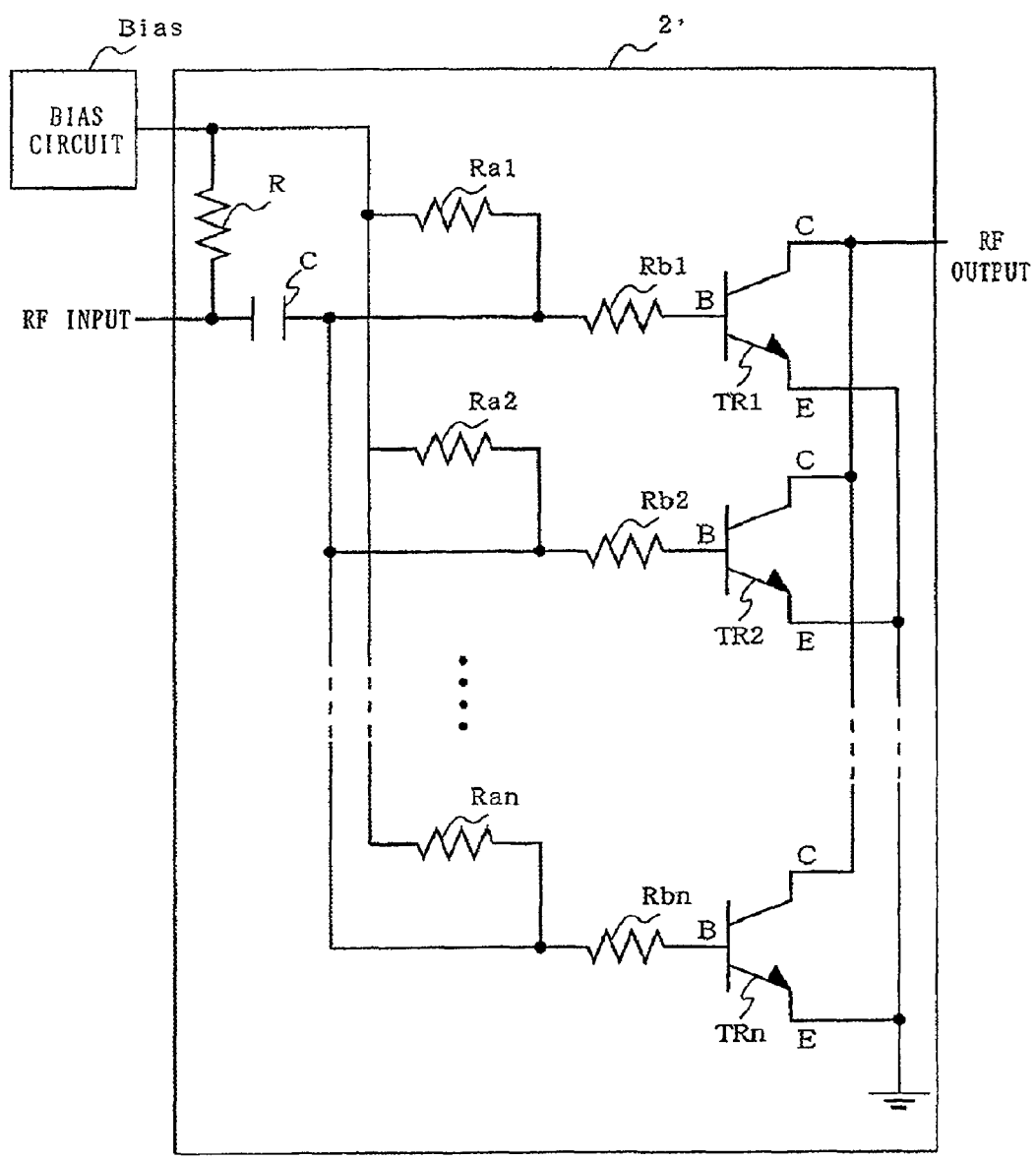
FIG. 11 shows a modified circuit configuration of the second embodiment of the present invention shown in FIG. 6.
Figure 12:
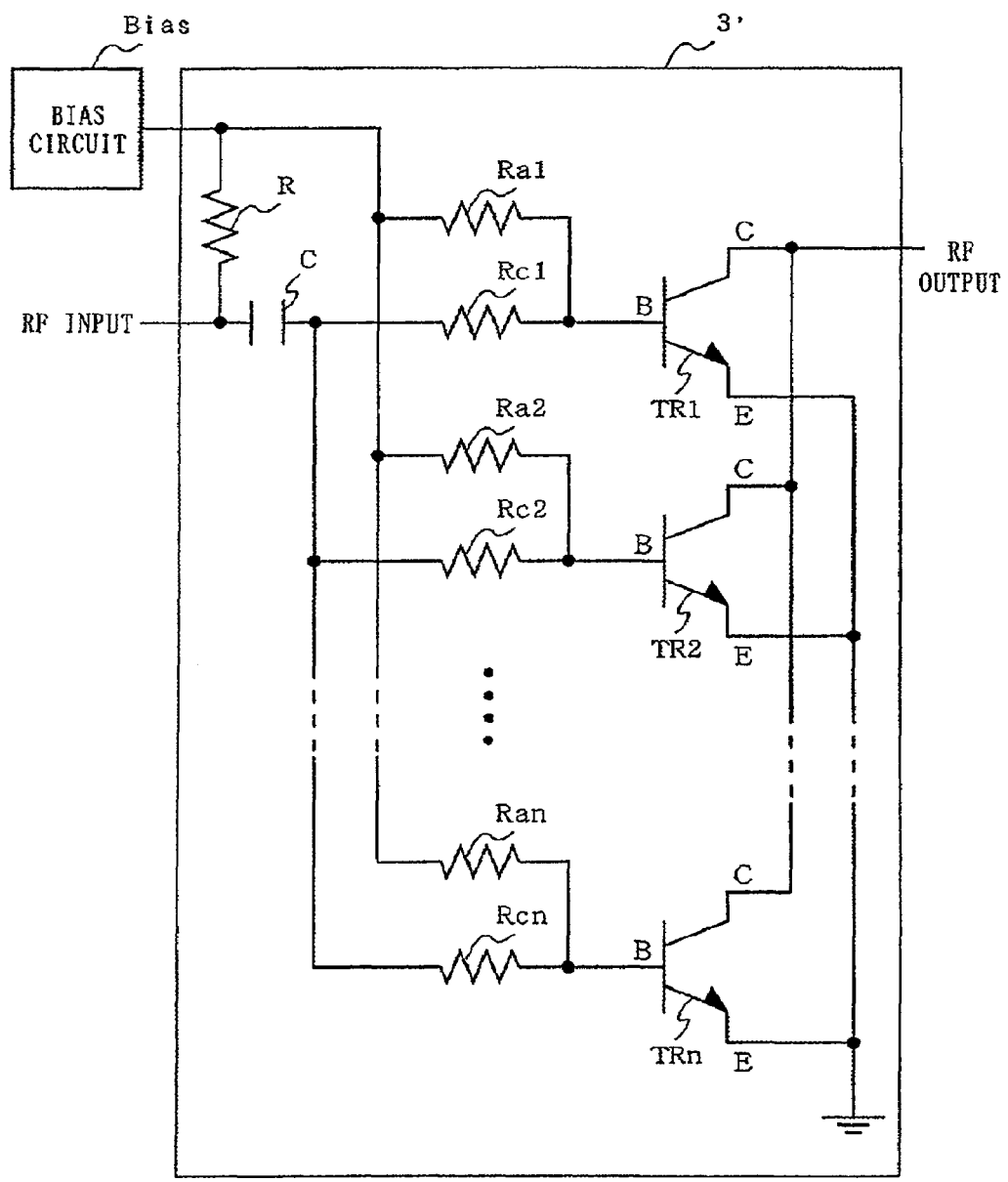
FIG. 12 shows a modified circuit configuration of the third embodiment of the present invention shown in FIG. 7.
Figure 13:
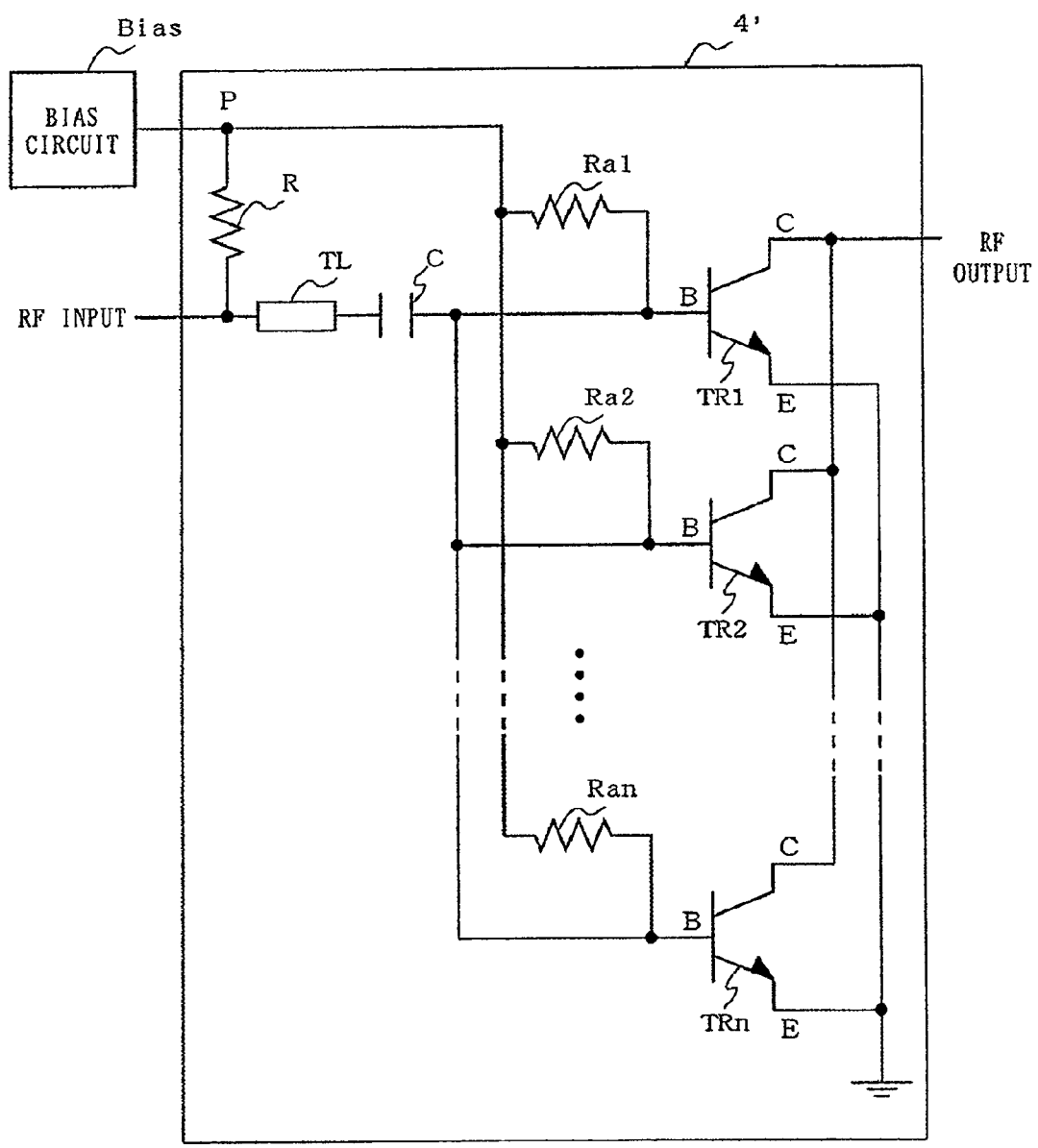
FIG. 13 shows a modified circuit configuration of the fourth embodiment of the present invention shown in FIG. 8.
Figure 14:
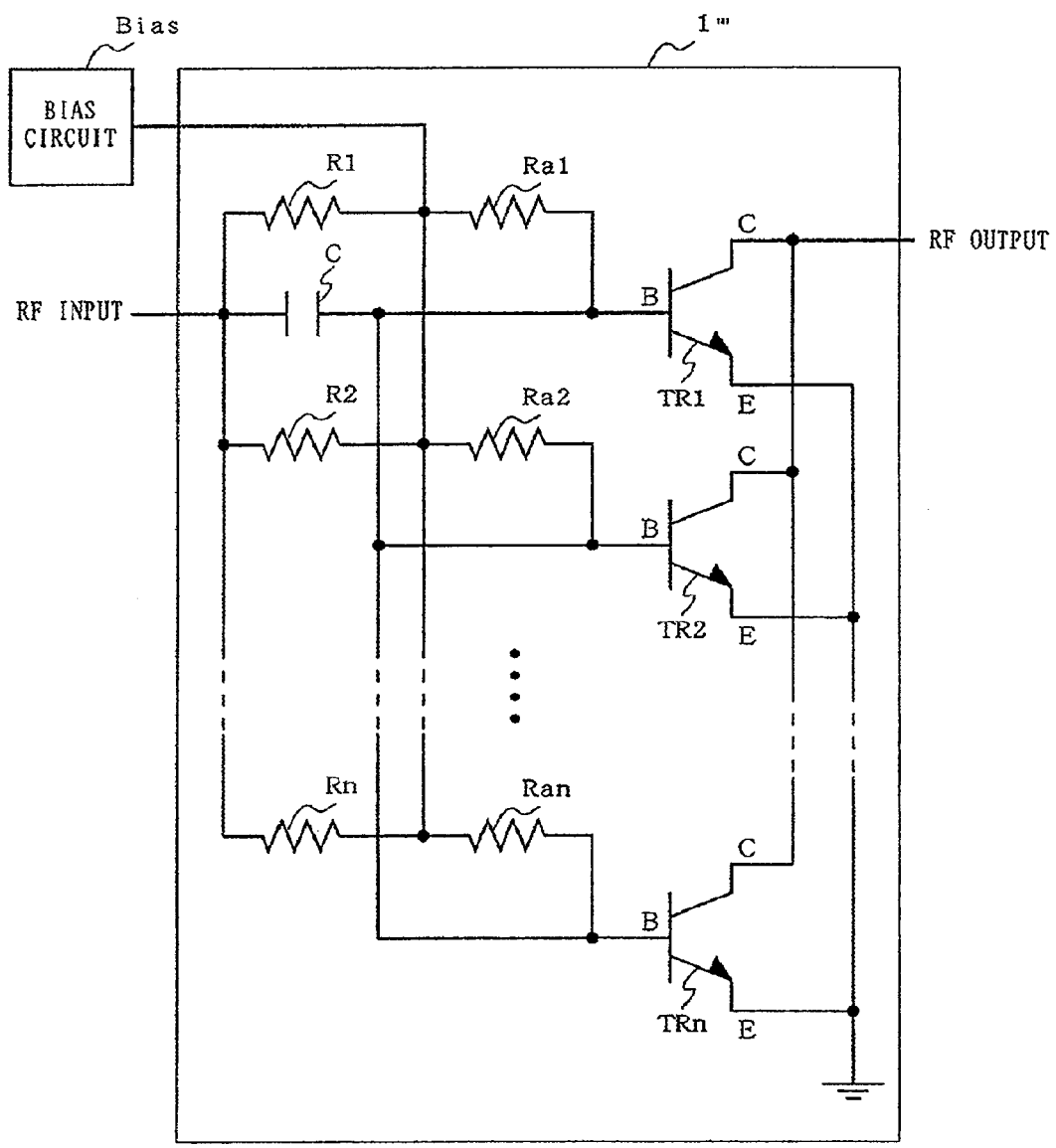
FIG. 14 shows a modified circuit configuration of the first embodiment of the present invention shown in FIG. 1.

With reference to FIG. 3A and FIG. 3B, the difference between the effect provided by the radio frequency power amplifier 1 according to the first embodiment and the effect provided by the conventional radio frequency power amplifier 100 (FIG. 10) will be described. The parameters used for the simulation in FIG. 3A and FIG. 3B are as shown in FIG. 3C.

FIG. 3A shows the output power Pout when the resistance value of the resistors Ra1 through Ran is variable where the resistance value of the bridge resistor R is 25Ω or 50Ω. FIG. 3B shows the power-added efficiency PAE when the resistance value of the resistors Ra1 through Ran is variable where the resistance value of the bridge resistor R is 25Ω or 50Ω. As can be appreciated from FIG. 3A and FIG. 3B, with the conventional radio frequency power amplifier 100, the characteristics drastically deteriorate approximately when the resistance value exceeds 1000Ω. By contrast, with the radio frequency power amplifier 1 according to the first embodiment, the characteristics do not deteriorate much even when the resistance value is about 2000Ω. When the resistance value is about 2000Ω, the radio frequency power amplifier 1 exhibits an output power Pout of about 1.5 dB and a power-added efficiency PAE of about 10%. This means that the characteristics can be significantly improved with the radio frequency power amplifier 1.

The reason why the characteristics are significantly improved is that a potential increase at the connection point P between the bridge resistor R and the resistors Ra1 through Ran compensates for the voltage drop at the resistors Ra1 through Ran. In addition, it is notable that the potential increase at the connection point P can be used to increase the resistance values of the resistors Ra1 through Ran and thus to improve the operation uniformity among the transistors TR1 through TRn.

As described above, the radio frequency power amplifier 1 according to the first embodiment of the present invention can provide both of a sufficient destruction resistance and superb radio frequency characteristics by inserting the bridge resistor R.

Figure 4:
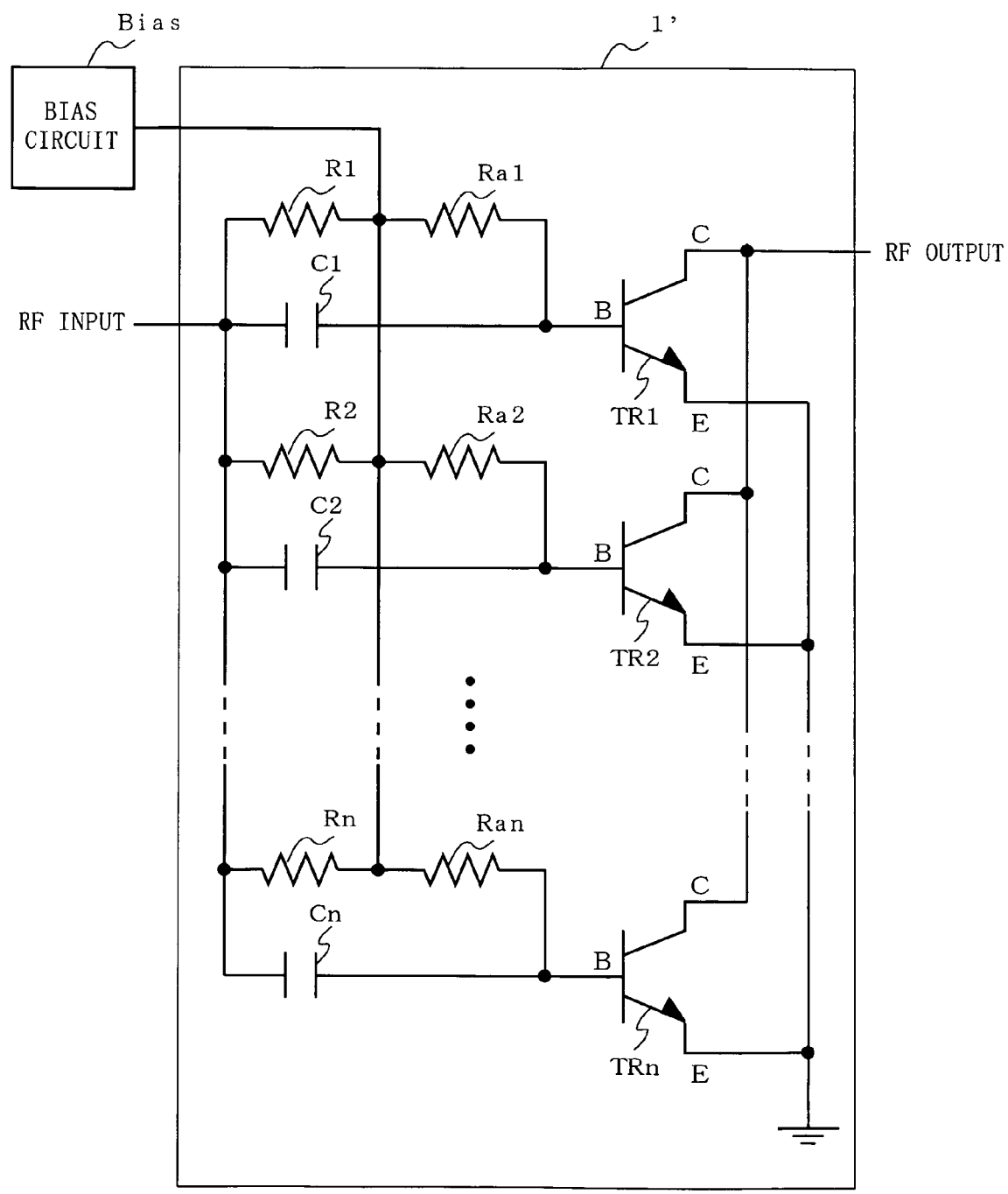
FIG. 4 shows a circuit configuration of another radio frequency power amplifier 1' according to the first embodiment of the present invention.
Figure 5:
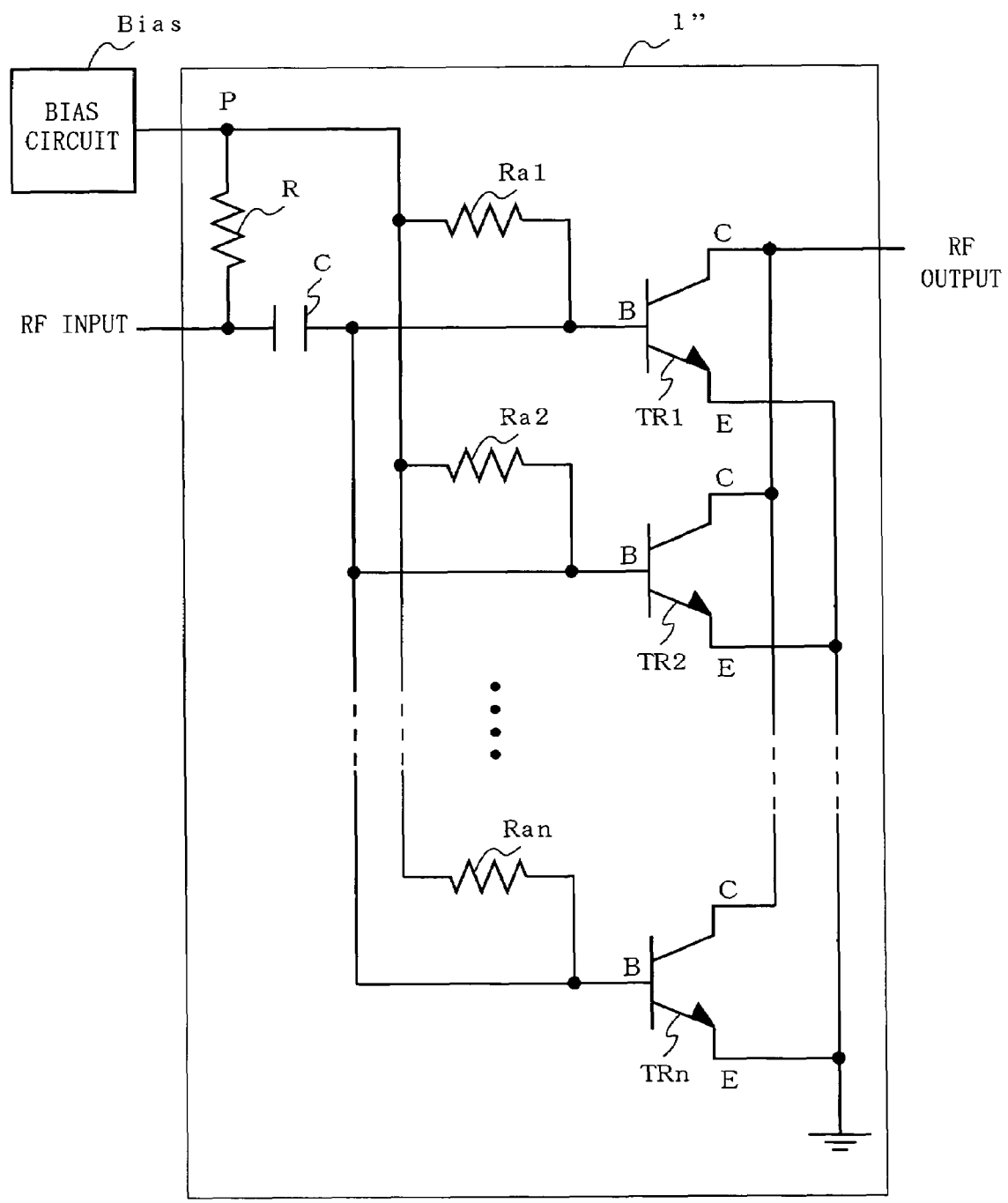
FIG. 5 shows a circuit configuration of still another radio frequency power amplifier 1" according to the first embodiment of the present invention.

In the first embodiment, one bridge resistor R is inserted. Alternatively, a radio frequency power amplifier 1' shown in FIG. 4 includes bridge resistors R1 through Rn respectively provided in correspondence with the transistors TR1 through TRn. With such a structure also, substantially the same effect is provided. Referring to FIG. 5, a radio frequency power amplifier 1" includes one capacitor C acting as an assembly of the plurality of capacitors C1 through Cn. With such a structure, substantially the same effect is provided.

Second Embodiment

Figure 6:
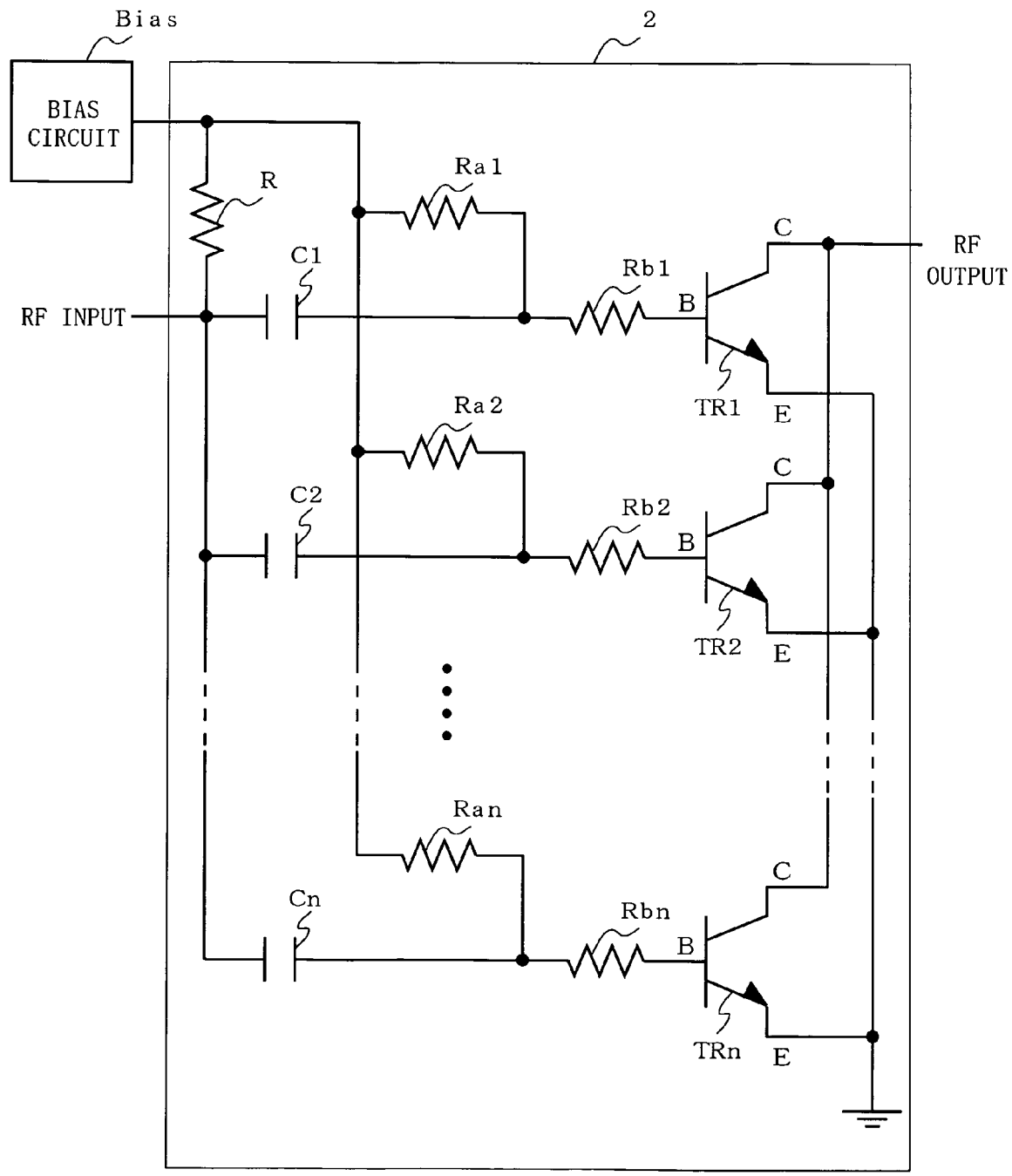
FIG. 6 shows a circuit configuration of a radio frequency power amplifier 2 according to a second embodiment of the present invention.

FIG. 6 shows a circuit configuration of a radio frequency power amplifier 2 according to a second embodiment of the present invention. As shown in FIG. 6, the radio frequency power amplifier 2 according to the second embodiment includes transistors TR1 through TRn, capacitors C1 through Cn, resistors Ra1 through Ran, resistors Rb1 through Rbn, and a bridge resistor R. As can be appreciated from FIG. 6, the radio frequency power amplifier 2 according to the second embodiment includes the resistors Rb1 through Rbn in addition to the structure of the radio frequency power amplifier 1 according to the first embodiment.

The resistors Rb1 through Rbn each have a very small resistance value, and respectively inserted between a connection point of the corresponding capacitor among the capacitors C1 through Cn and the corresponding resistor among the resistances Ra1 through Ran, and the base of the corresponding transistor among the transistors TR1 through TRn. Thus, the resistors Rb1 through Rbn act as base ballast resistances respectively for the transistors TR1 through TRn.

As described above, the radio frequency power amplifier 2 according to the second embodiment of the present invention includes the resistors Rb1 through Rbn each having a very small resistance value at the bases of the transistors TR1 through TRn. Owing to such a structure, the radio frequency power amplifier 2 stabilizes the transistors TR1 through TRn and suppresses an unnecessary oscillation thereof in addition to providing the effect described above in the first embodiment. Needless to say, the structure of the second embodiment is applicable to the structure including a plurality of bridge resistors R1 through Rn shown in FIG. 4 or the structure including a single capacitor C shown in FIG. 5.

Third Embodiment

Figure 7:
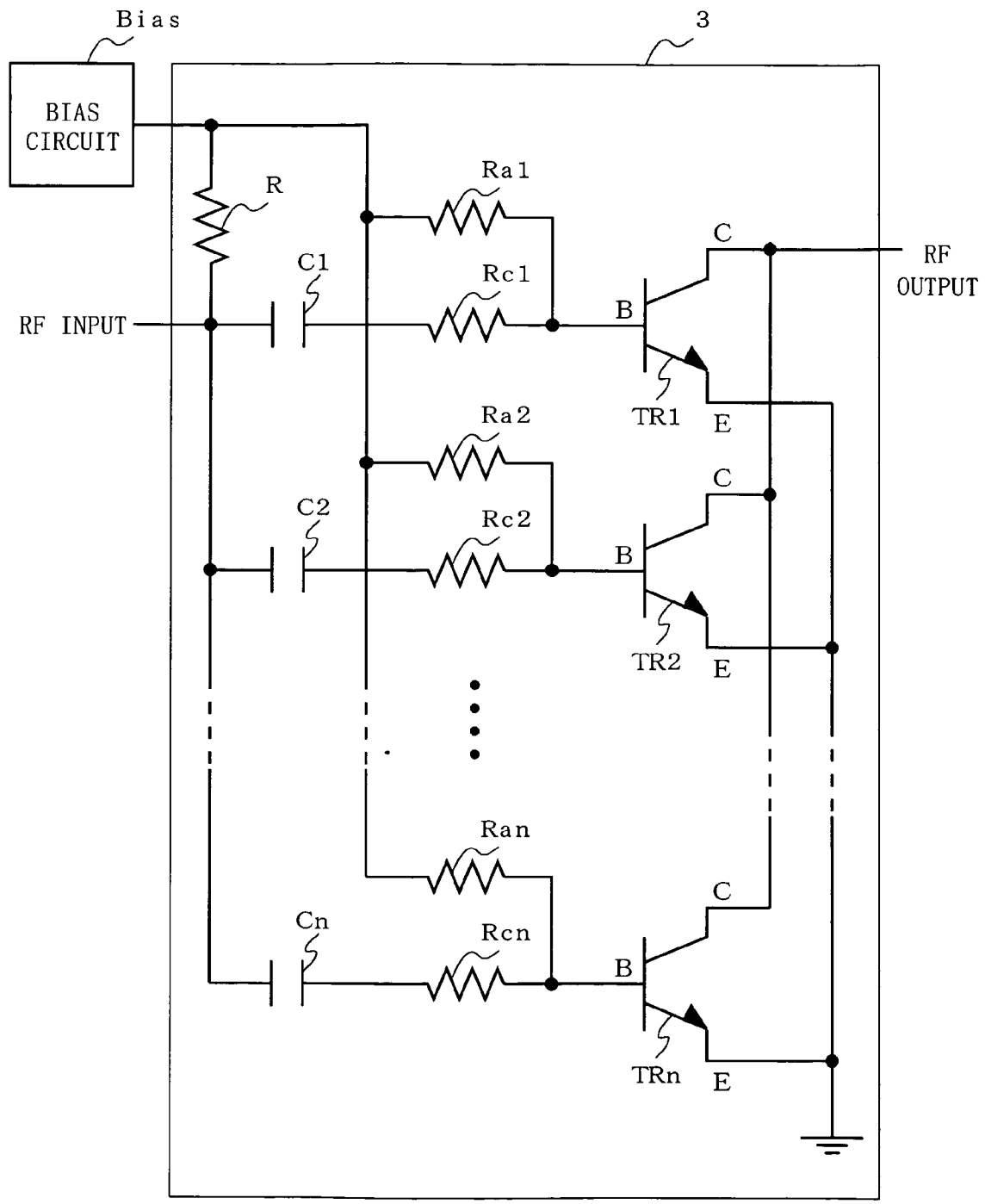
FIG. 7 shows a circuit configuration of a radio frequency power amplifier 3 according to a third embodiment of the present invention.

FIG. 7 shows a circuit configuration of a radio frequency power amplifier 3 according to a third embodiment of the present invention. As shown in FIG. 7, the radio frequency power amplifier 3 according to the third embodiment includes transistors TR1 through TRn, capacitors C1 through Cn, resistors Ra1 through Ran, resistors Rc1 through Rcn, and a bridge resistor R. As can be appreciated from FIG. 7, the radio frequency power amplifier 3 according to the third embodiment includes the resistors Rc1 through Rcn in addition to the structure of the radio frequency power amplifier 1 according to the first embodiment.

The resistors Rc1 through Rcn each have a very small resistance value, and inserted between the corresponding capacitor among the capacitors C1 through Cn, and a connection point of the corresponding resistor among the resistors Ra1 through Ran and the base of the corresponding transistor among the transistors TR1 through TRn. Thus, the resistors Rc1 through Rcn act as base ballast resistors respectively for the transistors TR1 through TRn.

As described above, the radio frequency power amplifier 3 according to the third embodiment of the present invention includes the resistors Rc1 through Rcn each having a very small resistance value at the bases of the transistors TR1 through TRn. Owing to such a structure, the radio frequency power amplifier 3 stabilizes the transistors TR1 through TRn and suppresses an unnecessary oscillation thereof in addition to providing the effect described above in the first embodiment. Needless to say, the structure of the third embodiment is applicable to the structure including a plurality of bridge resistors R1 through Rn shown in FIG. 4 or the structure including a single capacitor C shown in FIG. 5.

Fourth Embodiment

Figure 8:
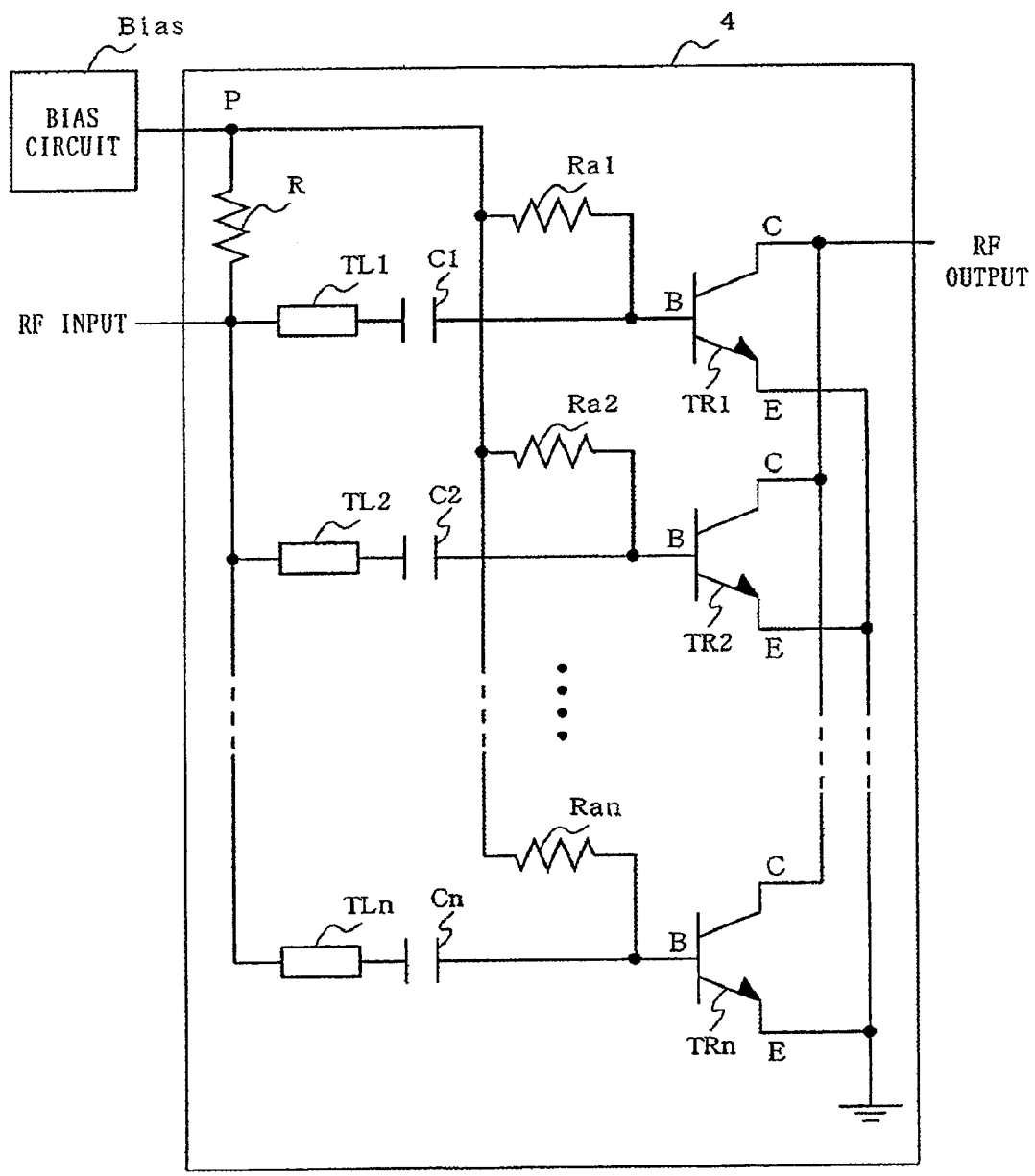
FIG. 8 shows a circuit configuration of a radio frequency power amplifier 4 according to a fourth embodiment of the present invention.

FIG. 8 shows a circuit configuration of a radio frequency power amplifier 4 according to a fourth embodiment of the present invention. As shown in FIG. 8, the radio frequency power amplifier 4 according to the fourth embodiment includes transistors TR1 through TRn, capacitors C1 through Cn, resistors Ra1 through Ran, transmission lines TL1 through TLn, and a bridge resistor R. As can be appreciated from FIG. 8, the radio frequency power amplifier 4 according to the fourth embodiment includes the transmission lines TL1 through TLn in addition to the structure of the radio frequency power amplifier 1 according to the first embodiment.

The transmission lines TL1 through TLn are each inserted between an input terminal for a radio frequency signal (RF) and the corresponding capacitor among the capacitors C1 through Cn. The transmission lines TL1 through TLn are resistance components generated by an inter-device line when the circuits of the radio frequency power amplifiers are actually laid-out on a semiconductor chip. The transmission lines TL1 through TLn generate self-resonance with the capacitors C1 through Cn and reduce the impedances between the input terminal for the radio frequency signal (RF) and the bases of the transistors TR1 through TRn. Since the radio frequency signal (RF) passes through the radio frequency amplifier 4 more easily, the radio frequency characteristics including the power gain are improved. Instead of the transmission lines TL1 through TLn, general resistors may be used.

As described above, the radio frequency power amplifier 4 according to the fourth embodiment of the present invention further improves the radio frequency characteristics by effectively using the transmission lines TL1 through TLn. The area size of the capacitors C1 through Cn can be reduced while providing the same level of radio frequency characteristics, which contributes to the reduction of the chip size. Needless to say, the structure of the fourth embodiment is applicable to the structure including a plurality of bridge resistors R1 through Rn shown in FIG. 4 or the structure including a single capacitor C shown in FIG. 5.

Fifth Embodiment

Figure 9:
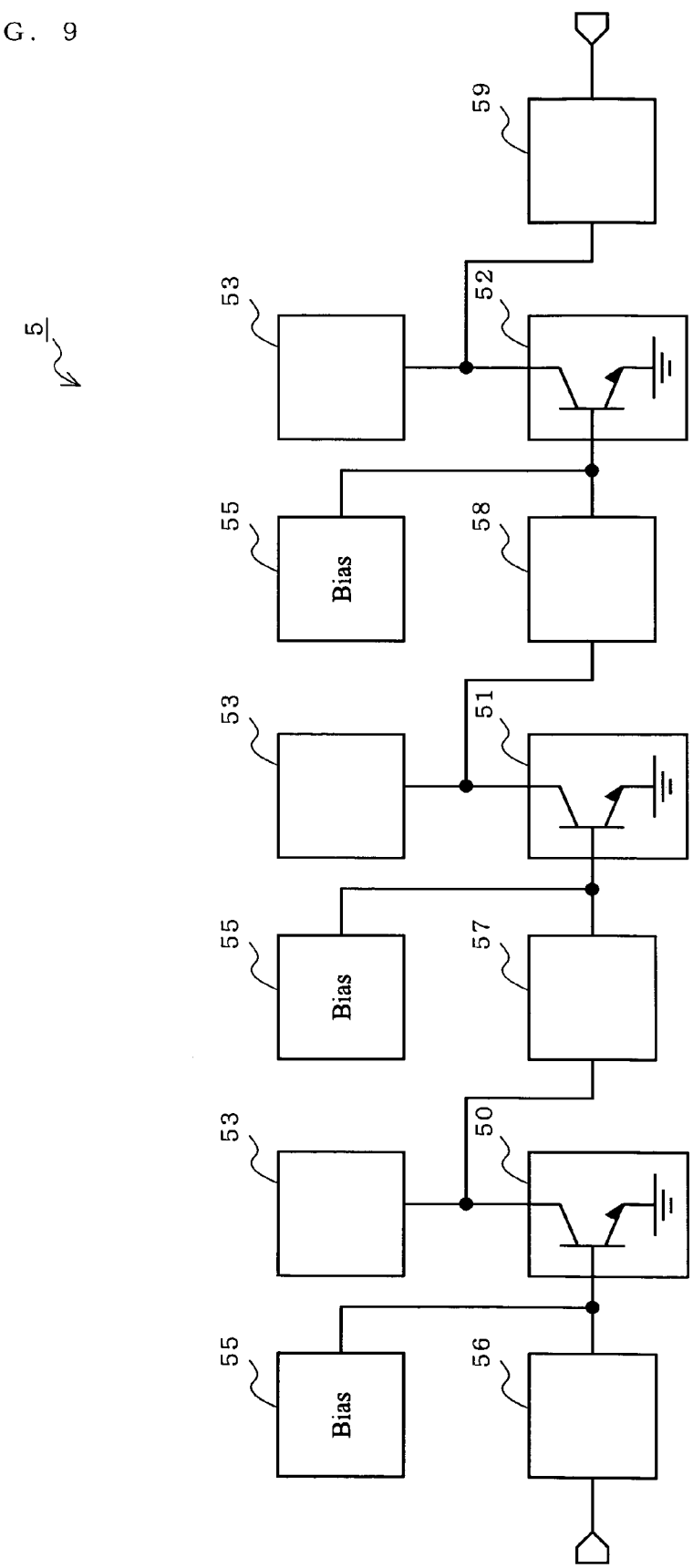
FIG. 9 shows a circuit configuration of a radio frequency power amplifier 5 according to a fifth embodiment of the present invention.

FIG. 9 shows a circuit configuration of a radio frequency power amplifier 5 according to a fifth embodiment of the present invention. As shown in FIG. 9, the radio frequency power amplifier 5 according to the fifth embodiment includes amplifiers 50 through 52, a plurality of collector bias circuits 53, a plurality of bias circuits 55, an input matching circuit 56, a first inter-stage matching circuit 57, a second inter-stage matching circuit 58, and an output matching circuit 59.

The amplifiers 50 through 52 each have a structure of any of the radio frequency power amplifiers 1 through 3 according to the first through third embodiments. Each of the plurality of bias circuits 55 connected to the amplifiers 50 through 52 is, for example, the bias circuit (Bias) described in the first embodiment. Each of the plurality of collector bias circuits 53 includes a transmission line (e.g., λ/4 line), an inductor or a capacitor, and supplies a bias voltage to the collectors of the transistors TR1 through TRn. The input matching circuit 56, the first inter-stage matching circuit 57, the second inter-stage matching circuit 58, and the output matching circuit 59 are for matching the different impedances of the transistors and providing radio frequency characteristics. The input matching circuit 56, the first inter-stage matching circuit 57, the second inter-stage matching circuit 58, and the output matching circuit 59 each include a transmission line, an inductor or a capacitor.

The radio frequency power amplifier 5 including a plurality of stages as described above can also provide both of a sufficient destruction resistance and superb radio frequency characteristics by using the radio frequency power amplifiers 1 through 3 according to the present invention. Especially, the radio frequency power amplifier 5 can minimize the characteristic differences among the different stages of amplifiers. Therefore, the radio frequency power amplifier 5 can be applied to a low distortion amplifier having improved linearity by appropriately adjusting the relationship between the input voltage and the bias voltage.

While the invention has been described in detail, the foregoing description is in all aspects illustrative and not restrictive. It is understood that numerous other modifications and variations can be devised without departing from the scope of the invention.

What is claimed is:

1. A radio frequency power amplifier usable for power amplification of a radio frequency signal, the radio frequency power amplifier comprising:
   a plurality of transistors connected in parallel and each having a grounded emitter;
   a plurality of first resistors each having one terminal commonly supplied with a direct current bias voltage and the other terminal connected to a base of the corresponding transistor among the plurality of transistors;
   a plurality of capacitors each having one electrode for commonly receiving the radio frequency signal and the other electrode connected to the base of the corresponding transistor among the plurality of transistors; and
   at least one bridge resistor for connecting the one terminal of each of the plurality of first resistors and the one electrode of each of the plurality of capacitors.

2. A radio frequency power amplifier usable for power amplification of a radio frequency signal, the radio frequency power amplifier comprising:
   a plurality of transistors connected in parallel and each having a grounded emitter;
   a plurality of first resistors each having one terminal commonly supplied with a direct current bias voltage and the other terminal connected to a base of the corresponding transistor among the plurality of transistors;
   a capacitor having one electrode for receiving the radio frequency signal and the other electrode connected to a base of each of the plurality of transistors; and
   at least one bridge resistor for connecting the one terminal of each of the plurality of first resistors and the one electrode of the capacitor.

3. A radio frequency power amplifier according to claim 1, further comprising a plurality of second resistors each inserted between a connection point of the other terminal of the corresponding resistor among the plurality of first resistors and the other electrode of the corresponding capacitor among the plurality of capacitors, and the base of the corresponding transistor among the plurality of transistors.

4. A radio frequency power amplifier according to claim 2, further comprising a plurality of second resistors each inserted between a connection point of the other terminal of the corresponding resistor among the plurality of first resistors and the other electrode of the capacitor, and the base of the corresponding transistor among the plurality of transistors.

5. A radio frequency power amplifier according to claim 1, further comprising a plurality of second resistors each inserted between the other electrode of the corresponding capacitor among the plurality of capacitors, and a connection point of the other terminal of the corresponding resistor among the plurality of first resistors and the base of the corresponding transistor among the plurality of transistors.

6. A radio frequency power amplifier according to claim 2, further comprising a plurality of second resistors each inserted between the other electrode of the capacitor, and a connection point of the other terminal of the corresponding resistor among the plurality of first resistors and the base of the corresponding transistor among the plurality of transistors.

7. A radio frequency power amplifier according to claim 1, further comprising a plurality of second resistors each inserted between a terminal of the at least one bridge resistor, to which the radio frequency signal is input, and the one electrode of the corresponding capacitor among the plurality of capacitors.

8. A radio frequency power amplifier according to claim 2, further comprising a second resistor inserted between a terminal of the at least one bridge resistor, to which the radio frequency signal is input, and the one electrode of the capacitor.

9. A radio frequency power amplifier according to claim 7, each include a transmission line wherein a plurality of transmission lines act as the plurality of second resistors.

10. A radio frequency power amplifier according to claim 8, wherein a transmission line acts as the second resistor.

11. A radio frequency power amplifier according to claim 1, comprising a plurality of bridge resistors respectively provided in correspondence with the plurality of first resistors.

12. A radio frequency power amplifier according to claim 2, comprising a plurality of bridge resistors respectively provided in correspondence with the plurality of first resistors.

13. A radio frequency power amplifier according to claim 1, wherein the direct current bias voltage is supplied from a bias circuit which uses an emitter follower as an output structure.

14. A radio frequency power amplifier according to claim 2, wherein the direct current bias voltage is supplied from a bias circuit which uses an emitter follower as an output structure.

* * * * *